(12) United States Patent
De Groot et al.

(10) Patent No.: US 9,389,518 B2
(45) Date of Patent: Jul. 12, 2016

(54) STAGE SYSTEM AND A LITHOGRAPHIC APPARATUS

(71) Applicant: ASML Netherlands B.V., Veldhoven (NL)

(72) Inventors: Antonius Franciscus Johannes De Groot, Someren (NL); Raymond Wilhelmus Louis Lafarre, Helmond (NL); Yang-Shan Huang, Veldhoven (NL); Sander Christiaan Broers, Weert (NL); Peter Laurentius Maria Ros, Haaksbergen (NL)

(73) Assignee: ASML Netherlands B.V., Veldhoven (NL)

( * ) Notice: Subject to any disclaimer, the term of this patent is extended or adjusted under 35 U.S.C. 154(b) by 449 days.

(21) Appl. No.: 13/686,854

(22) Filed: Nov. 27, 2012

(65) Prior Publication Data

US 2013/0162968 A1    Jun. 27, 2013

Related U.S. Application Data

(60) Provisional application No. 61/579,368, filed on Dec. 22, 2011.

(51) Int. Cl.
*G03F 7/20* (2006.01)
*G03B 27/58* (2006.01)

(52) U.S. Cl.
CPC ............ *G03F 7/70758* (2013.01); *G03B 27/58* (2013.01); *G03F 7/70775* (2013.01)

(58) Field of Classification Search
CPC ............ G03F 7/70758; G03F 7/70766; G03F 7/70783; G03F 7/70775; G03B 27/58

USPC .......................... 355/72–77; 310/12.05–12.06
See application file for complete search history.

(56) References Cited

U.S. PATENT DOCUMENTS

| | | | | |
|---|---|---|---|---|
| 5,699,621 | A * | 12/1997 | Trumper et al. | ................ 33/1 M |
| 5,841,250 | A * | 11/1998 | Korenage et al. | ............. 318/135 |
| 6,259,174 | B1 * | 7/2001 | Ono | ................... G06F 7/70758 310/13 |
| 6,437,463 | B1 | 8/2002 | Hazelton et al. | |
| 7,589,823 | B2 * | 9/2009 | Shibazaki | ....................... 355/72 |
| 7,737,419 | B2 | 6/2010 | Asano | |
| 7,742,149 | B2 | 6/2010 | De Vos et al. | |
| 8,269,949 | B2 | 9/2012 | Vermeulen et al. | |

(Continued)

FOREIGN PATENT DOCUMENTS

JP    2008-004647 A    1/2008
JP    2008-300828 A    12/2008

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A movable stage system is configured to support an object. The stage system comprises an object table configured to support the object and an object table support defining an object table support surface configured to support the object table. The object table support comprises at least one first actuator to drive the object table support in a first driving direction substantially parallel to the object table support surface. In a projection on a plane parallel to the object table support surface the at least one actuator is spaced with respect to the object table in a direction perpendicular to the first driving direction such that the risk on slip between the object table support and the object table supported thereon is decreased.

20 Claims, 5 Drawing Sheets

(56) References Cited

U.S. PATENT DOCUMENTS

| | | | |
|---|---|---|---|
| 2002/0074510 A1* | 6/2002 | Ono | G06F 7/70758 |
| | | | 250/442.11 |
| 2003/0034695 A1 | 2/2003 | Binnard et al. | |
| 2003/0098962 A1* | 5/2003 | Kubo | 355/72 |
| 2003/0173833 A1 | 9/2003 | Hazelton et al. | |
| 2004/0004703 A1 | 1/2004 | Hazelton | |
| 2005/0156552 A1* | 7/2005 | Sekiguchi | 318/575 |
| 2005/0174551 A1* | 8/2005 | Phillips | 355/53 |
| 2005/0218842 A1* | 10/2005 | Yang et al. | 318/114 |
| 2008/0012511 A1* | 1/2008 | Ono | 318/35 |
| 2009/0290139 A1 | 11/2009 | Van Der Sijs et al. | |
| 2010/0073653 A1* | 3/2010 | Shibazaki | 355/53 |
| 2010/0085551 A1* | 4/2010 | Vermeulen et al. | 355/71 |
| 2011/0102761 A1 | 5/2011 | Yoshimoto | |
| 2012/0019794 A1 | 1/2012 | Hol et al. | |
| 2012/0212723 A1 | 8/2012 | Hol et al. | |
| 2013/0033122 A1* | 2/2013 | Binnard | G06F 7/70716 |
| | | | 310/12.06 |

FOREIGN PATENT DOCUMENTS

| | | |
|---|---|---|
| JP | 2010-028096 A | 2/2010 |
| JP | 2010-093252 A | 4/2010 |
| JP | 2013-506267 A | 2/2013 |

* cited by examiner

STAGE SYSTEM AND A LITHOGRAPHIC APPARATUS

BACKGROUND

1. Field of the Invention

The present invention relates to a stage system and a lithographic apparatus comprising a stage system.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus comprises a movable stage system configured to support a substrate. The stage system is movable to position the substrate supported thereon in six degrees of freedom with high accuracy. The main plane of movement of the stage system is parallel to the main plane of the substrate, for example the horizontal plane, although the stage system is usually also capable of moving the substrate over a small range in the direction perpendicular to the main plane of the substrate, e.g., the vertical direction.

The stage system may comprise a substrate table configured to support the substrate and an encoder block. At its bottom side the substrate table comprises a large number of burls to be arranged on a substrate table support surface of the encoder block. The substrate table is clamped by means of a vacuum clamp and/or electrostatic clamp on the substrate table support surface. The clamping force should be sufficient to maintain the substrate table in the same position with respect to the encoder block. The normal force, i.e., the force with which the substrate table is pressed against the encoder block multiplied by the friction coefficient should be larger than the shear force in the burls introduced by acceleration of the substrate table and encoder block and/or by deformation of the encoder block to avoid (local) slip between the substrate table and the substrate table support.

The encoder block comprises actuators to actuate the encoder block in two or more directions and an encoder system to measure the position of the encoder block. Since the position of the substrate table and the substrate supported thereon is measured based on the position of the encoder block, it is undesirable that the substrate table moves with respect to the encoder block, as movement of the substrate table with respect to the encoder block may result in misalignment of the substrate with respect to the patterned beam. Such misalignment may cause overlay errors.

In the prior art stage system Lorentz actuators are used to drive the encoder block in a driving direction. The Lorentz actuators are arranged in the driving direction serially with respect to the substrate table, i.e., see in the driving direction before and after the substrate table. As a result, the load in the driving direction of the Lorentz actuators on the support table support surface will result in hot spot peaks of material stress in some burls of the substrate table.

These hot spot peaks of material stress may locally have a negative influence by having increased local shear forces and reduced normal forces on the substrate table which may result in local slip between the substrate table and the substrate table support when acceleration levels become too high.

To increase throughput of a lithographic apparatus, it is desirable to increase the acceleration with which the substrate stage is accelerated to the scanning speed. However, the local slip effect between the substrate table and the substrate table support limits the possibilities of increasing the acceleration levels used in the stage system.

SUMMARY

It is desirable to provide a stage system comprising an object table and an object table support, wherein the stage system is capable of high accelerations without slip occurring between the object table and the object table support. Furthermore, it is desirable to provide a substrate stage system for a lithographic apparatus comprising a substrate table and a substrate table support, for example an encoder block, wherein the substrate stage system is capable of high accelerations without slip occurring between the substrate table and the substrate table support. Also, it is desirable to provide a stage system comprising an object support, wherein the stage system is capable of high accelerations without slip occurring between the object and the object support.

According to an embodiment of the present invention, there is provided a movable stage system configured to support an object, wherein the stage system comprises: an object table configured to support the object, and an object table support defining an object table support surface configured to support the object table, wherein the object table support comprises at least one first actuator to drive the object table support in a first driving direction substantially parallel to the object table support surface. In a projection on a plane parallel to the object table support surface the at least one actuator is spaced with respect to the object table in a direction perpendicular to the first driving direction such that the risk on slip between the object table support and the object table supported thereon is decreased.

According to an embodiment of the present invention, there is provided a lithographic apparatus comprising: an illumination system configured to condition a radiation beam, a support constructed to support a patterning device, the patterning device being capable of imparting the radiation beam with a pattern in its cross-section to form a patterned radiation beam, a substrate support constructed to hold a substrate, and a projection system configured to project the patterned radiation beam onto a target portion of the substrate. The lithographic apparatus comprises a movable stage system configured to support an object. The stage system comprises: an object table configured to support the object, and an object table support defining an object table support surface configured to support the object table, wherein the object table support comprises at least one first actuator to drive the object table support in a first driving direction substantially parallel to the object table support surface. In a projection on a plane parallel to the object table support surface the at least one actuator is spaced with respect to the object table in a direction perpendicular to the first driving direction, wherein the stage system is the patterning device support or the substrate support such that the risk on slip between the object table support and the object table supported thereon is decreased.

According to an embodiment of the present invention, there is provided a movable stage system configured to support an object, wherein the stage system comprises an object support defining an object support surface configured to support the object, wherein the object support comprises at least one first actuator to drive the object support in a first driving direction substantially parallel to the object support surface. In a projection on a plane parallel to the object support surface the at least one actuator is spaced with respect to an object supported on the object support in a direction perpendicular to the first driving direction such that the risk on slip between the object support and the object supported thereon is decreased.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
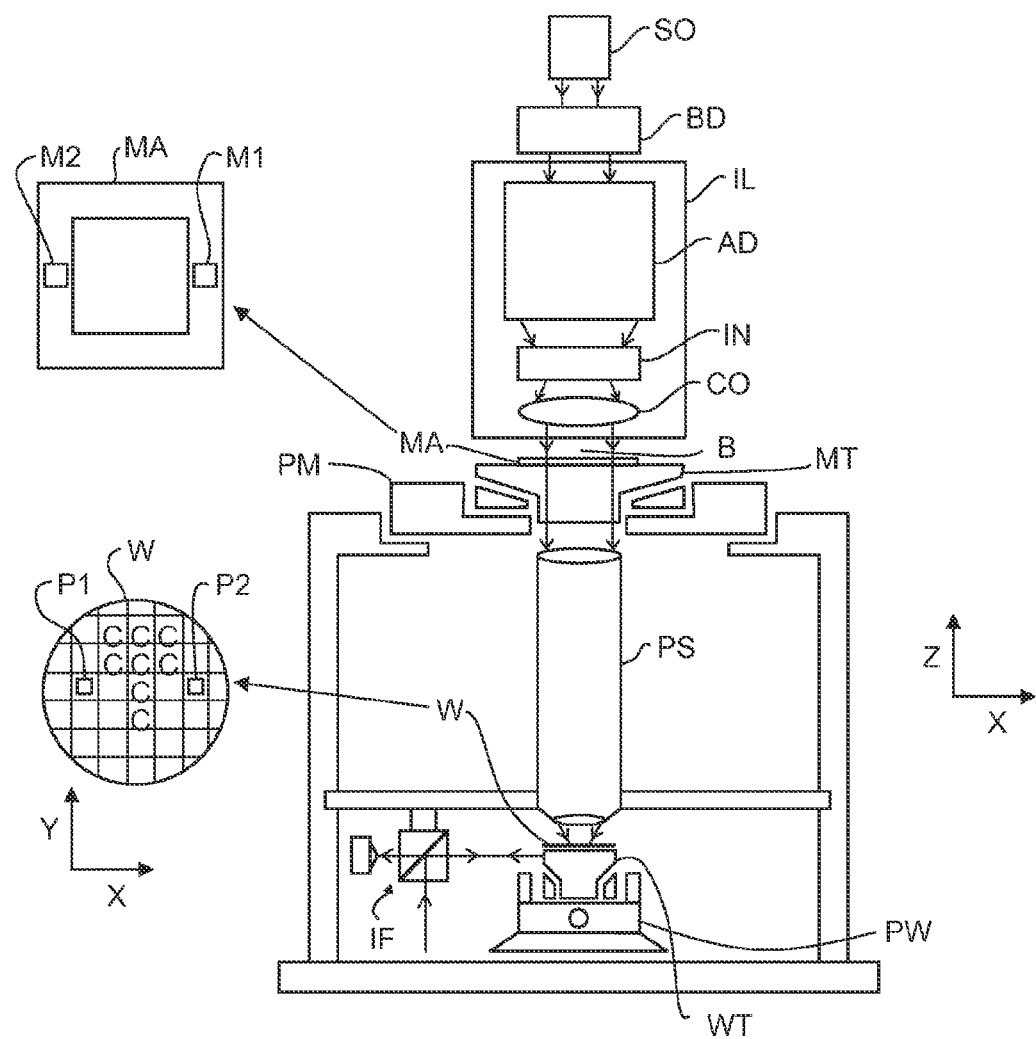
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
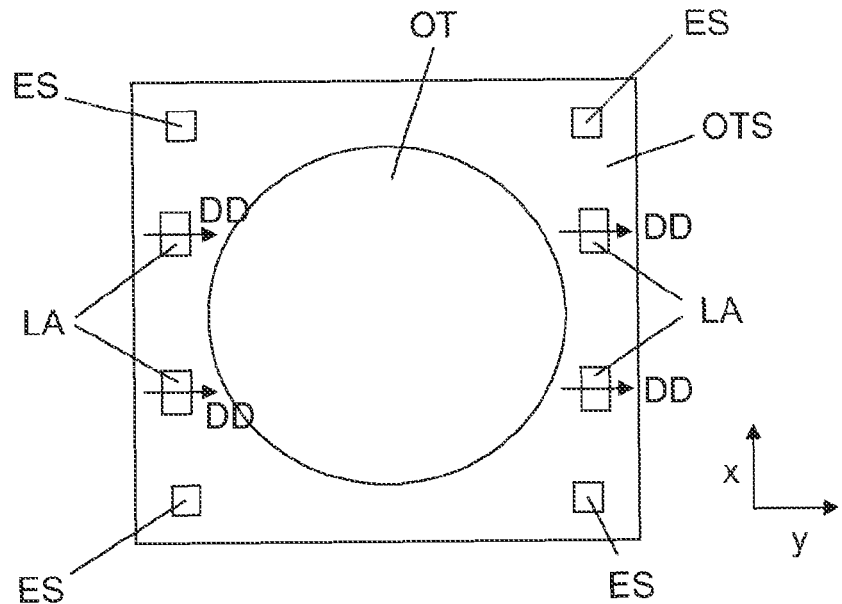
FIG. 2 depicts a top view of an actuator arrangement in a prior art stage system.

FIG. 2 depicts a prior art movable substrate stage system of a lithographic apparatus comprising a substrate table depicted as object table OT and an encoder block, depicted as object table support OTS. The object table support OTS comprises an object table support surface, for example a encoder block pot hole, configured to support the object table OT. The object table support surface extends in the x-y plane.

The object table support OTS comprises a number of encoder sensors ES to measure a position of the OTS with respect to one or more grid plates mounted on a reference element, for example a reference frame. The encoder sensors ES shown in FIG. 2 are configured to measure the position of the object table support OTS in six degrees of freedom.

The object table OT is clamped with a vacuum clamp on the object table support surface.

The substrate table support OTS comprises a number of Lorentz actuators LA, each being configured to drive the substrate table support OTS and therewith the substrate table OS in a driving direction DD. In FIG. 2, only Lorentz actuators for driving in a first driving direction DD, the y-direction, are shown. In substrate stage systems for a lithographic apparatus, usually further actuators will be provided to move the object table support OTS in the x-direction and the z-direction such that positioning of the object table support is possible in six degrees of freedom.

The top view of FIG. 2 can be regarded as a projection on a plane parallel to the object table support surface, since the object table support surface extends in the x-y plane.

In this projection, the Lorentz actuators are arranged in the driving direction serially with respect to the object table OT, i.e., when seen in the driving direction DD before and after the object table OT. As a result of this relative position between the Lorentz actuators LA and the object table OT, the normal load of the Lorentz actuators LA in the driving direction DD resulting from actuation of the Lorentz actuators LA on the support table support surface will result in hot spot peaks of material stress in the plane between the object table support OTS and the object table OT.

These hot spot peaks of material stress may locally have a negative influence by having increased local shear forces and reduced normal forces on the object table OT resulting in local slip between the object table OT and the object table support OTS. This slip may lead to a different position between the object table OT and the object table support OTS. As the substrate is supported by the object table OT and the position of the substrate is determined on the basis of a position of the object table support, these different positions may lead to misalignment of the substrate with respect to a patterning device, and, as a result, in overlay errors in subsequent layers on the substrate.

With increasing accelerations of the object table support OTS, the risk on slip between the object table OT and the object table support OTS increases.

Figure 3:
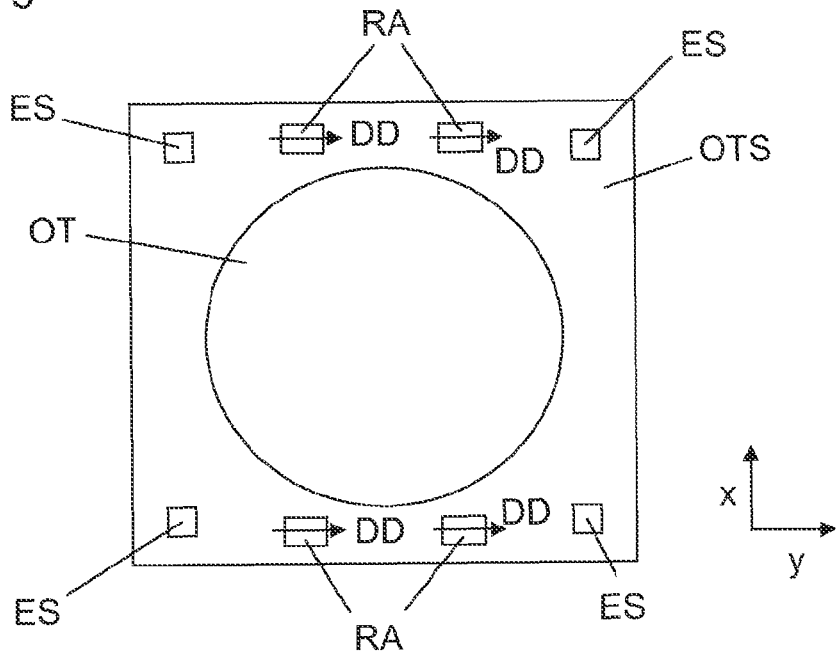
FIG. 3 depicts a top view of an actuator arrangement in an embodiment of a stage system according to the present invention.
Figure 4:
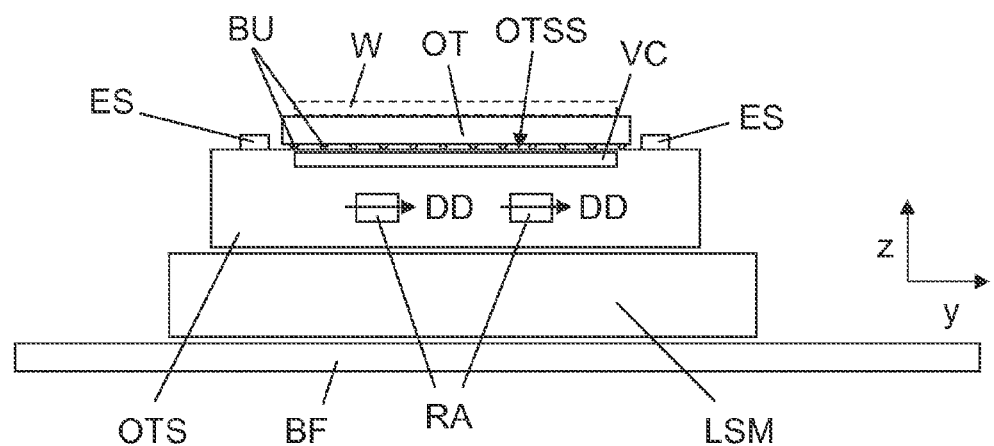
FIG. 4 depicts a side view of the stage system of FIG. 3.

FIG. 3 shows a top view of movable substrate stage system according to an embodiment of the present invention. A side view of this movable substrate stage system is shown in FIG. 4. The substrate stage system comprises a substrate table depicted as object table OT configured to support a substrate and a substrate table depicted as object table support OTS comprising an object table support surface OTSS configured to support the object table OT. The object table support surface OTSS is not necessarily a flat surface, but may for example also be defined by a number of protrusions or other elements. The object table support surface OTSS extends in the x-y plane.

The object table support OTS comprises a number of encoder sensors ES to measure a position of the OTS with respect to one or more grid plates mounted on a reference element, for example a reference frame. The encoder sensors ES are configured to measure the position of the object table support OTS in six degrees of freedom.

Any other position measurement system, such as an interferometer system may also be applied. An embodiment of an interferometer system for example comprises a number of interferometer sensors mounted on a reference element, for example a reference frame. The interferometer sensors emit a light beam towards a mirror element on the object table support. For example, the object table support may be a mirror block comprising reflective side surfaces acting as mirror elements. The reflected light beam is combined with a reference beam so that a change in position of the object table support with respect to the reference element can be determined on the basis of interference between the reflected light beam and the reference beam.

In another embodiment, the encoder sensors may be arranged on one or more reference elements, such as a reference frame. One or more grid plates may be mounted on the object table support to cooperate with the encoder sensors on the reference elements.

The object table OT is clamped with a vacuum clamp VC on the object table support surface. OTSS. In addition or as an alternative, any other type of clamping, such as an electrostatic or magnetic clamping system, may also be applied.

At the bottom side of the object table OT a number of burls BU (see FIG. 4) are provided to form a vacuum space between the object table OT and the object table support OTS. These burls BU are pressed by the vacuum force with a certain normal force against the object table support surface OTSS. The clamping force should be sufficient to maintain the object table OT in a constant position with respect to the object table support OTS. For each of the burls BU the normal force, i.e., the force with which the object table OT is pressed against the object table support OTS multiplied by a friction coefficient between object table OT and object table support OTS should be larger than the shear force in the burls BU introduced by acceleration of the object table OT and object table support OTS and/or by deformation of the object table support OTS to avoid (local) slip between the object table OT and the object table support OTS.

Furthermore, unflatness of the object table OT, misalignment between center of gravity of combination of object table OT and object table support OTS and center of force exerted by the actuators, and the presence of particles may have a decreasing effect on the normal force, and thus an increasing risk on slip. Increasing the vacuum force of the vacuum clamp VC may increase the mean normal force, but may, during acceleration, decrease locally the normal force, since the increase in vacuum force in combination with misalignment between center of gravity and center of force increases the risk on slip due to tilting of the object table OT. The actuator arrangement as shown in FIG. 3 may increase the possibilities to increase accelerations without introducing slip between the object table OT and the object table support OTS.

The object table support OTS comprises four reluctance actuators, preferably variable reluctance actuators RA, each configured to drive the object table support OTS in the driving direction DD, in this case the y-direction. In practice, further reluctance actuators may be provided to drive the object support table in other driving directions, for example in the x-direction and/or the z-direction. The reluctance actuators RA may be any reluctance actuator suitable for driving the object table support OTS. In an embodiment, the reluctance actuator may comprise first and second magnetic members that are displaceable relative to each other to provide a magnetic circuit having a variable reluctance; a coil for, in use, receiving a current for generating a magnetic flux through the magnetic circuit; a measurement coil for generating a measurement signal representative of the magnetic flux through the magnetic circuit, whereby the measurement coil is arranged to substantially enclose the magnetic flux through the magnetic circuit; and a control unit arranged to receive the measurement signal at an input terminal and, in response, provide a control signal based on the measurement signal at an output terminal for controlling an amplitude of the current or a force of a further actuator.

Further characteristics and/or embodiments of reluctance actuators suitable for driving the object table support OTS are for example described in co-pending U.S. Pub. Appl. No. 2012-0019794, the contents of which are herein incorporated by reference in its entirety, and/or co-pending U.S. Pub. Appl. No. 2012-0212723, the contents of which are herein incorporated by reference in its entirety.

Instead of reluctance actuators also other suitable types of actuators may be provided.

Similar to FIG. 2, the top view of FIG. 3 can be regarded as a projection on a plane parallel to the object table support surface OTSS, since the object table support surface OTSS extends in the x-y plane which is parallel to the plane of the drawing.

The reluctance actuators RA are arranged in the projection shown in FIG. 3 spaced with respect to the object table OT in the direction perpendicular to the driving direction DD. In other words when, in this projection, the object table OT is moved in the driving direction the path of the object table OT and the paths of the reluctance actuators RA will be parallel to each other, but non-overlapping. It is remarked that in the direction perpendicular to the object table support surface OTSS, in this embodiment the z-direction, the object table support surface OTSS and the reluctance actuators RA may be arranged at the same or different levels.

In the embodiment shown in FIG. 3, the reluctance actuators are also arranged in an area next to the object table OT in the direction perpendicular to the driving direction, here the x-direction. Thus, in this x-direction the reluctance actuators are arranged serially with respect to the object table OT, or in other words, when the object table OT is, the projection, moved in the x-y plane in the direction perpendicular to the driving direction (x-direction) the paths of the object table OT and the reluctance actuators RA overlap each other.

Since the hot spot peaks of material stress are more dominantly located in the normal direction of the actuators, i.e., the driving direction DD, the object table support surface OTSS and the burls BU of the object table OT are less influenced by these hot spot peaks. Instead the forces are introduced tangentially into the object table support OTS towards the object table support surface OTSS and the object table OT. As the shear modulus is lower than the Young's modulus, the actuator force of each of the reluctance actuators RA is divided, in the direction towards the object table OT, over a larger area of the object table support. This results in a more even stress distribution in the area of the object table support surface OTSS.

As a consequence of this actuator arrangement, and the stress distribution in the object table support surface, the change in normal forces in individual burls BU is less influenced by the stress caused by the reluctance actuators RA. The level of acceleration and/or deceleration of the object table support OTS may be increased with substantially less risk on slip between the object table OT and the object table support OTS.

FIG. 4 further shows that the object table support OTS is mounted on a long stroke module LSM of the stage system. The reluctance actuators RA are arranged to move the object table support OTS with high accuracy over a relative small range with respect to the long stroke module LSM. The long stroke module LSM may comprise further actuators to position, with lower accuracy, the long stroke module LSM with respect to a base frame BF. With the combination of long stroke module LSM movable over a large range with respect to the base frame and the object table support which is movable over a short stroke with respect to the long stroke module a substrate W supported on the object table OT can be positioned with high accuracy over a large range.

Figure 5:
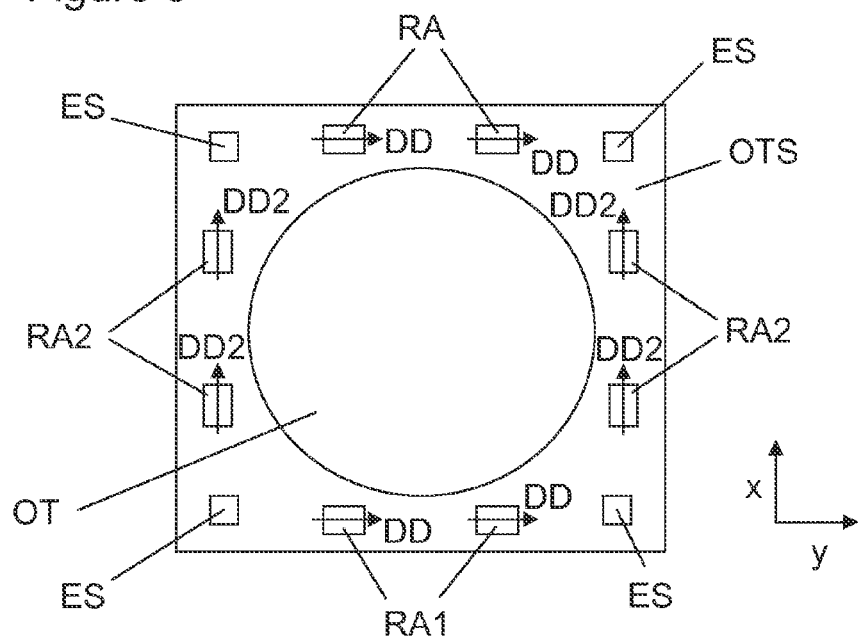
FIG. 5 depicts a top view of an embodiment of an actuator arrangement to actuate the stage in two direction in the x-y plane.

FIG. 5 shows the substrate stage system of FIGS. 3 and 4 with a set of second reluctance actuators RA2 configured to drive the object table support OTS in a second driving direction DD2 in the x-y plane substantially perpendicular to the driving direction DD, i.e., the x-direction. Further actuators may be provided to drive the object table support OTS in the z-direction, i.e., perpendicular to the x-y plane.

The second reluctance actuators RA2 are arranged in the projection shown in FIG. 5 spaced with respect to the object table OT in the direction perpendicular to the second driving direction DD2. In other words when, in the projection, the object table OT is moved in the second driving direction DD2 the path of the object table OT and the paths of the second reluctance actuators RA2 will be parallel to each other, and non-overlapping.

Further, in the embodiment shown in FIG. 5, the second reluctance actuators RA2 are arranged in an area next to the object table OT in the direction perpendicular to the second driving direction DD2. In other words, the second reluctance actuators RA2 are arranged serially with respect to the object table OT in the direction perpendicular to the second driving direction DD2.

The arrangement of the set of second actuators RA2 with respect to the object table OT, has the same advantage as the reluctance actuators RA configured to drive the object table support OTS in the y-direction. In particular, the normal direction (second driving direction DD2) of the second actuators RA2, is not directed towards the object table OT therewith avoiding the introduction of hot spot peak stresses in the object table support surface OTSS and the burls BU.

It is remarked that the actuator arrangement according to the present invention may be applied for any stage system, wherein the stage system comprises an object support defining an object support surface configured to support the object, wherein the object support comprises at least one first actuator to drive the object support in a first driving direction substantially parallel to the object support surface.

In such stage system, in a projection on a plane parallel to the object support surface, the at least one actuator is spaced with respect to an object supported on the object support in a direction perpendicular to the first driving direction. In the embodiments shown in the drawings, the object is the object table OT and the object support is the object table support OTS.

Figure 6:
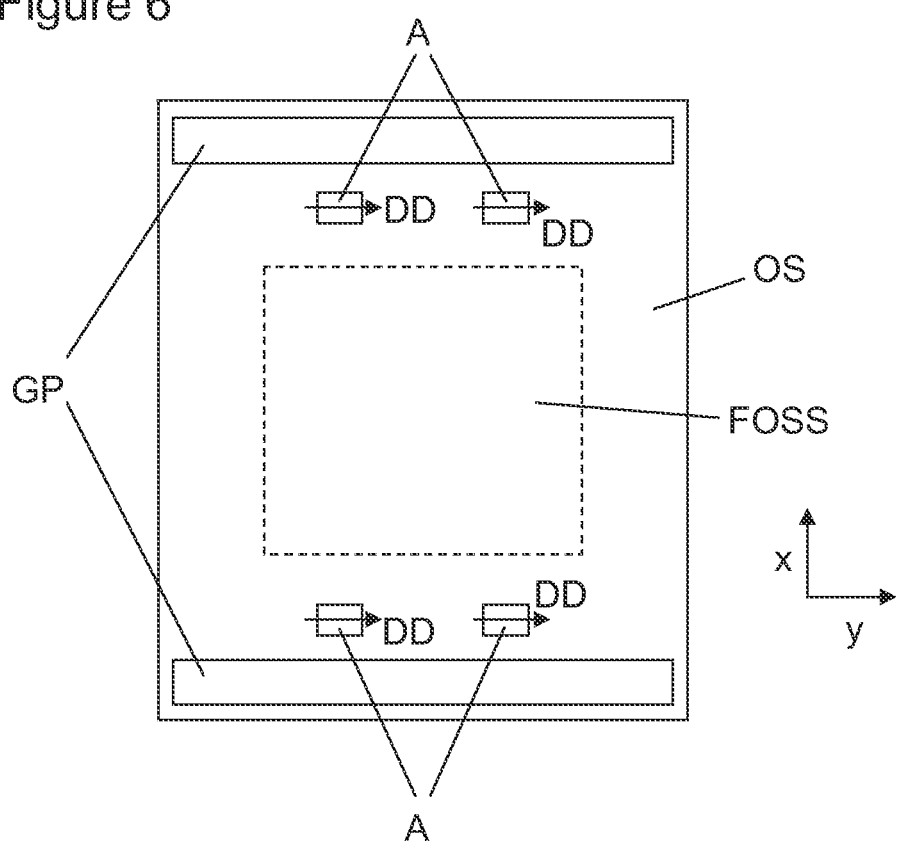
FIG. 6 depicts a top view of another embodiment of a stage system according to the present invention.

FIG. 6 shows another embodiment of a stage system according to the present invention, wherein the arrangement of actuators is selected to avoid, or at least decrease risk on slip between an object support and an object supported thereon.

The stage system of FIG. 6 comprises an object support OS with four actuators A, for example reluctance actuators or Lorentz actuators. The actuators A are configured to drive the object support OS in a driving direction DD.

Furthermore, the stage system comprises two objects in the form of grid plates GP clamped on a supporting surface of the object support OS. The support surface extends in the x-y plane. FIG. 6 may be regarded as a projection on the x-y plane. The clamping system may be any suitable system, such as, for example, a vacuum, electrostatic, or magnetic clamping system.

To avoid stress peaks in the supporting surface for the grid plates GP, the actuators A are arranged, in a projection on a plane parallel to the support surface, spaced with respect to the support surface and the grid plates supported thereon in a direction perpendicular to the driving direction DD. By this actuator arrangement risk on slip between each grid plate GP and the object support OS is decreased, in particular for higher levels of acceleration.

It is remarked that the stage system comprises a further object support surface FOSS. This further object support surface FOSS may for example be configured to support a substrate or patterning device. Advantageously, the actuators A are also spaced with respect to the further object table support surface FOSS in a direction perpendicular to the driving direction DD. By this relative arrangement of actuators A and the further object support surface FOSS also stress peaks in the further object support surface FOSS are avoided.

Figure 7:
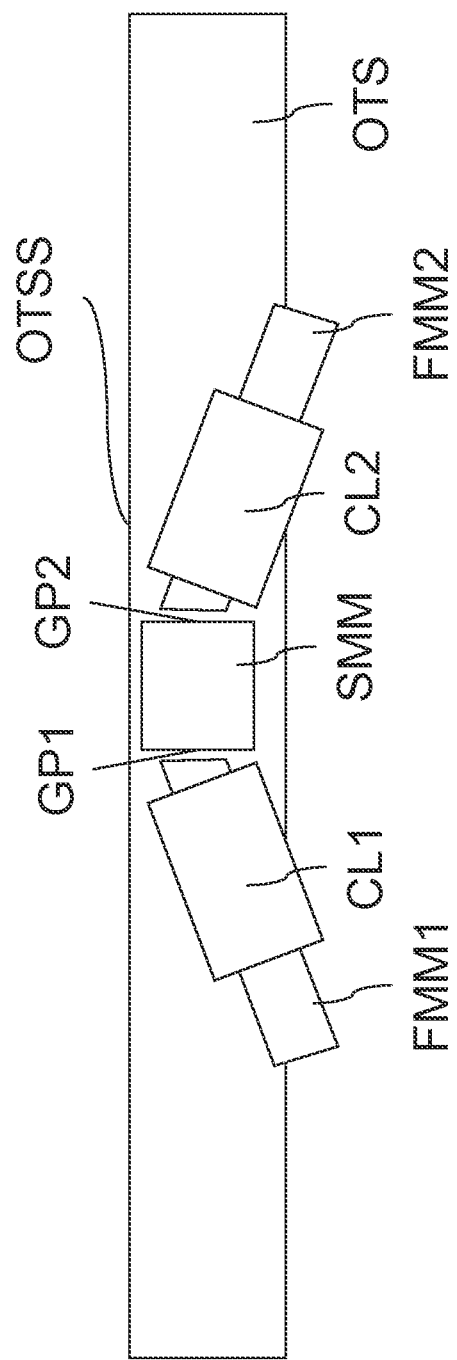
FIG. 7 depicts a side view of an alternative actuator arrangement in an embodiment of a stage system according to the present invention.

It is further remarked that in general a reluctance actuator has a first magnetic member (FMM) being approximately in-plane with the object table support surface (OTSS). Accordingly the coil (CL) wound around the first magnetic member of the reluctance actuator may protrude outside the object table support (OTS) in case the object table support is relatively slender. As the coil of the reluctance actuator is protruding, the reluctance actuator as a whole may be lowered with respect to the object table support surface. This might however cause undesired moments on the object table support (OTS) and as such on the object table (OT). In an alternative embodiment, the reluctance actuator may be inclined having an inclined first magnetic member (FMM) with respect to the object table support surface (OTSS) as shown in FIG. 7. In such an embodiment, the coil (CL1, CL2) of the reluctance actuator is no longer protruding above the object table support surface (OTSS) and consequently the reluctance actuator forces acting in the gap (GP1, GP2) between the first magnetic member (FMM1, FMM2) and second magnetic member (SMM) can act closer to the desired level, minimizing moments on the object table support (OTS). A further advantage when placing the reluctance actuators underneath the object table support (OTS) instead of placing the actuators at the circumference of the object table support, is that the pockets which have to be made into the object table support to accommodate the actuators can remain smaller in comparison with a not inclined actuator which generally results in a more stiff object table support.

The present invention may also be used for any other object support supporting an object, whereby there is a risk on slip between the object support and the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A movable stage system, comprising:
   an object table configured to support an object; and
   an object table support defining an object table support surface configured to support the object table,
   wherein the object table support comprises a first actuator and a second actuator configured to drive the object table support in a first driving direction substantially parallel to the object table support surface, and wherein the object table support comprises a third actuator and a fourth actuator configured to drive the object table support in a second driving direction substantially parallel to the object table support surface and substantially perpendicular to the first driving direction,
   wherein the first actuator and the second actuator are spaced from each other in a direction parallel to the first driving direction, and wherein the third actuator and the fourth actuator are spaced from each other in a direction parallel to the second driving direction, and
   wherein, in a projection on a plane parallel to the object table support surface, the first actuator and the second actuator are spaced apart from each other in a direction perpendicular to the first driving direction and at a distance greater than a width of the object table, and
   wherein, in a projection on a plane parallel to the object table support surface, the third actuator and the fourth actuator are spaced apart from each other in a direction perpendicular to the second driving direction and at a distance greater than the width of the object table.

2. The stage system of claim 1, wherein the first actuator and the second actuator are arranged in an area next to the object table in the direction perpendicular to the driving direction.

3. The stage system of claim 1, wherein:
   the stage system comprises a fifth actuator, wherein the fifth actuator is spaced with respect to the object table in a direction perpendicular to the first driving direction.

4. The stage system of claim 1, wherein any one of the first actuator, the second actuator, the third actuator, and the fourth actuator is a reluctance actuator.

5. The stage system of claim 4, wherein the reluctance actuator is a variable reluctance actuator.

6. The stage system of claim 1, further comprising a non-mechanical clamp system to clamp the object table on the object table support surface.

7. The stage system of claim 6, wherein the clamp system is a vacuum clamp.

8. The stage system of claim 7, wherein a side of the object table directed to the object table support surface comprises multiple burls configured to be arranged on the object table support surface to form a vacuum space between the object table support surface and the object table.

9. The stage system of claim 1, wherein the third actuator is arranged in an area next to the object table in the direction perpendicular to the second driving direction.

10. The stage system of claim 1, wherein the object table is a substrate table and the object table support is an encoder block of a substrate stage system of a lithographic apparatus.

11. The stage system of claim 1, wherein the first actuator, the second actuator, the third actuator, and the fourth actuator are each arranged on the object table support.

12. The stage system of claim 11, wherein each of the first actuator, the second actuator, the third actuator, and the fourth actuator comprise a coil wrapped around a magnetic member.

13. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a movable stage system, comprising:
      an object table configured to support the object;
      an object table support defining an object table support surface configured to support the object table,
      wherein the object table support comprises a first actuator and a second actuator configured to drive the object table support in a first driving direction substantially parallel to the object table support surface, and wherein the object table support comprises a third actuator and a fourth actuator configured to drive the object table support in a second driving direction substantially parallel to the object table support surface and substantially perpendicular to the first driving direction,
      wherein the first actuator and the second actuator are spaced from each other in a direction parallel to the first driving direction, and wherein the third actuator and the fourth actuator are spaced from each other in a direction parallel to the second driving direction, and wherein, in a projection on a plane parallel to the object table support surface, the first actuator and the second actuator are spaced apart from each other in a direction perpendicular to the first driving direction and at a distance greater than a width of the object table, wherein, in a projection on a plane parallel to the object table support surface, the third actuator and the fourth actuator are spaced apart from each other in a direction perpendicular to the second driving direction and at a distance greater than the width of the object table, and wherein the movable stage system is the patterning device support or the substrate support.

14. The lithographic apparatus of claim 13, wherein the first actuator, the second actuator, the third actuator, and the fourth actuator are each arranged on the object table support.

15. The lithographic apparatus of claim 14, wherein each of the first actuator, the second actuator, the third actuator, and the fourth actuator comprise a coil wrapped around a magnetic member.

16. A movable stage system, comprising:

an object table support defining an object table support surface configured to support an object on an object table, wherein the object table support comprises a first actuator and a second actuator configured to drive the object table support in a first driving direction substantially parallel to the object table support surface, and wherein the object table support comprises a third actuator and a fourth actuator configured to drive the object table support in a second driving direction substantially parallel to the object table support surface and substantially perpendicular to the first driving direction, wherein the first actuator and the second actuator are spaced from each other in a direction parallel to the first driving direction, and wherein the third actuator and the fourth actuator are spaced from each other in a direction parallel to the second driving direction, and wherein, in a projection on a plane parallel to the object table support surface, the first actuator and the second actuator are spaced apart from each other in a direction perpendicular to the first driving direction and at a distance greater than a width of the object table, wherein, in a projection on a plane parallel to the object table support surface, the third actuator and the fourth actuator are spaced apart from each other in a direction perpendicular to the second driving direction and at a distance greater than the width of the object table.

17. The stage system of claim 16, wherein the object is a grid plate of an encoder measurement system mounted on the object support.

18. The movable stage system of claim 16, wherein the first actuator, the second actuator, the third actuator, and the fourth actuator are each arranged on the object table support.

19. The movable stage system of claim 18, wherein each of the first actuator, the second actuator, the third actuator, and the fourth actuator comprise a coil wrapped around a magnetic member.

20. A movable stage system, comprising:

an object table configured to support the object;

an object table support defining an object table support surface configured to support the object table, wherein the object table support comprises a first actuator and a second actuator each configured to drive the object table support in a first driving direction substantially parallel to the object table support surface, wherein, in a projection on a plane parallel to the object table support surface, the first actuator and the second actuator are spaced apart from each other in a direction perpendicular to the first driving direction and at a distance greater than a width of the object table such that a risk of slip between the object table support and the object table supported thereon is decreased, and wherein a magnetic member of the first actuator or the second actuator is inclined with respect to the object table support surface.

* * * * *